(12) United States Patent
Jung

(10) Patent No.: US 12,245,375 B2
(45) Date of Patent: Mar. 4, 2025

(54) CIRCUIT BOARD

(71) Applicant: LG INNOTEK CO., LTD., Seoul (KR)

(72) Inventor: Won Suk Jung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 204 days.

(21) Appl. No.: 17/996,285

(22) PCT Filed: Apr. 16, 2021

(86) PCT No.: PCT/KR2021/004795
§ 371 (c)(1),
(2) Date: Oct. 14, 2022

(87) PCT Pub. No.: WO2021/210941
PCT Pub. Date: Oct. 21, 2021

(65) Prior Publication Data
US 2023/0199959 A1 Jun. 22, 2023

(30) Foreign Application Priority Data

Apr. 16, 2020 (KR) ........................ 10-2020-0046110

(51) Int. Cl.
*H05K 1/00* (2006.01)
*H05K 1/02* (2006.01)
*H05K 1/11* (2006.01)

(52) U.S. Cl.
CPC .......... *H05K 1/116* (2013.01); *H05K 1/0298* (2013.01); *H05K 2201/09827* (2013.01); *H05K 2201/09854* (2013.01)

(58) Field of Classification Search
CPC ................ H05K 1/116; H05K 1/0298; H05K 2201/09827; H05K 2201/09854
See application file for complete search history.

(56) References Cited

U.S. PATENT DOCUMENTS 6,010,769 A   1/2000  Sasaoka et al.
8,933,556 B2  1/2015  Naganuma et al.
(Continued)

FOREIGN PATENT DOCUMENTS

KR   10-1998-0016837 A   6/1998
KR   10-1999-0067668 A   8/1999
(Continued)

OTHER PUBLICATIONS

JP 2022148980 A; English Translation (Year: 2022).*
International Search Report dated Aug. 5, 2021 in International Application No. PCT/KR2021/004795.

*Primary Examiner* — Pete T Lee
(74) *Attorney, Agent, or Firm* — Saliwanchik, Lloyd & Eisenschenk

(57) ABSTRACT

A circuit board according to an embodiment includes a first insulating layer; a second insulating layer disposed on an upper surface of the first insulating layer; a first circuit pattern buried in a lower region of the first insulating layer and including a first via pad; a second circuit pattern disposed between the first insulating layer and the second insulating layer and including a second via pad; a third circuit pattern buried in an upper region of the second insulating layer and including a third via pad; a first via disposed in the first insulating layer and connecting the first via pad and the second via pad; and a second via disposed in the second insulating layer and connecting the second via pad and the third via pad, and wherein at least one of an upper surface and a lower surface of the second via includes a convex portion in an upward or downward direction.

20 Claims, 9 Drawing Sheets

(56) References Cited

U.S. PATENT DOCUMENTS

| | | | |
|---|---|---|---|
| 2008/0185176 A1 | 8/2008 | Hagihara | |
| 2012/0153463 A1 | 6/2012 | Maeda | |
| 2012/0186866 A1* | 7/2012 | Mikado | H05K 3/4602 |
| | | | 29/832 |
| 2013/0284506 A1* | 10/2013 | Zanma | H05K 1/185 |
| | | | 29/832 |
| 2014/0014398 A1 | 1/2014 | Kim et al. | |
| 2014/0041923 A1* | 2/2014 | Hisada | H05K 1/115 |
| | | | 174/266 |

FOREIGN PATENT DOCUMENTS

| | | |
|---|---|---|
| KR | 10-2012-0067968 A | 6/2012 |
| KR | 10-2012-0094523 A | 8/2012 |
| KR | 10-2014-0008923 A | 1/2014 |
| KR | 10-2019-0012873 A | 2/2019 |
| KR | 10-2019-0069164 A | 6/2019 |

\* cited by examiner

CIRCUIT BOARD

CROSS-REFERENCE TO RELATED APPLICATIONS

This application is the U.S. national stage application of International Patent Application No. PCT/KR2021/004795, filed Apr. 16, 2021, which claims the benefit under 35 U.S.C. § 119 of Korean Application No. 10-2020-0046110, filed Apr. 16, 2020, the disclosures of each of which are incorporated herein by reference in their entirety.

TECHNICAL FIELD

The embodiment relates to a circuit board, and more particularly, to a circuit board having a structure in which a circuit pattern of an outermost layer is buried in an insulating layer, and a method of manufacturing the same.

BACKGROUND ART

A line width of circuits is becoming smaller as the miniaturization, weight reduction, and integration of electronic components accelerate. In particular, as design rules of semiconductor chips are integrated on a nanometer scale, a circuit line width of a package substrate or a circuit board on which a semiconductor chip is mounted is reduced to several micrometers or less.

In order to increase the degree of circuit integration of the circuit board, that is, various methods have been proposed in order to miniaturize the circuit line width. In order to inhibit loss of circuit line width in the etching step to form a pattern after copper plating, a semi-additive process (SAP) method and a modified semi-additive process (MSAP) have been proposed.

Thereafter, an Embedded Trace Substrate (hereinafter referred to as 'ETS') method in which copper foil is buried in an insulating layer to implement a finer circuit pattern has been used in the art. The ETS method is manufactured by embedding the copper foil circuit in the insulating layer instead of forming it on the surface of the insulating layer. For this reason, there is no circuit loss due to etching, so it is advantageous to refine the circuit pitch.

Meanwhile, recently, efforts are being made to develop an improved 5th generation (5G) communication system or a pre-5G communication system in order to meet the demand for wireless data traffic. Here, the 5G communication system uses ultra-high frequency (mmWave) bands (sub 6 gigabytes (6 GHz), 28 gigabytes 28 GHz, 38 gigabytes 38 GHz or higher frequencies) to achieve high data rates.

And, in order to alleviate the path loss of radio waves in the very high frequency band and increase the propagation distance of radio waves, aggregation technologies such as beamforming, massive WM, and array antenna are being developed in the 5G communication system. Considering that these frequency bands can consist of hundreds of active antennas of wavelengths, the antenna system becomes relatively large.

Since these antennas and AP modules are patterned or mounted on a circuit board, low loss of the circuit board is very important. This means that several substrates constituting the active antenna system, ie, an antenna substrate, an antenna feeding substrate, a transceiver substrate, and a baseband substrate, must be integrated into one compact unit.

And, the circuit board applied to the 5G communication system as described above is manufactured in the trend of light, thin and compact, accordingly, the circuit pattern is becoming more and more fine.

However, the conventional circuit board including a fine circuit pattern has a structure in which the outermost circuit pattern protrudes on the insulating layer, and accordingly, there is a problem in that the outermost circuit pattern easily collapses.

DISCLOSURE

Technical Problem

The embodiment provides a circuit board having a novel structure and a method of manufacturing the same.

In addition, the embodiment provides a circuit board having a structure in which all circuit patterns of an outermost layer are buried in an insulating layer, and a method of manufacturing the same.

In addition, the embodiment provides a circuit board in which circuit patterns of an outermost layer has a symmetrical structure with respect to a center of the insulating layer, and a method of manufacturing the same.

The technical problem to be solved in the embodiment is not limited to the technical problem mentioned above, and another technical problem not mentioned will be clearly understood by those of ordinary skill in the art to which the present invention belongs from the following description.

Technical Solution

A circuit board according to an embodiment includes a first insulating layer; a second insulating layer disposed on an upper surface of the first insulating layer; a first circuit pattern buried in a lower region of the first insulating layer and including a first via pad; a second circuit pattern disposed between the first insulating layer and the second insulating layer and including a second via pad; a third circuit pattern buried in an upper region of the second insulating layer and including a third via pad; a first, via disposed in the first insulating layer and connecting the first via pad and the second via pad; and a second via disposed in the second insulating layer and connecting the second via pad and the third via pad, and wherein at least one of an upper surface and a lower surface of the second via includes a convex portion in an upward or downward direction.

In addition, the lower surface of the second via has a curved surface convex in a downward direction, and wherein an upper surface of the second via pad has a curved surface concave in a downward direction corresponding to the lower surface of the second via.

In addition, the upper surface of the second via pad includes: a first portion in contact with the lower surface of the second via; and a second portion other than the first portion; wherein the first portion of the upper surface of the second via pad has a concave curved surface corresponding to the lower surface of the second via; and wherein the second portion of the upper surface of the second via pad has a flat surface.

In addition, the upper surface of the second via has a curved surface convex in an upward direction, and wherein a lower surface of the third via pad has a curved surface concave in an upward direction corresponding to the upper surface of the second via.

In addition, the lower surface of the third via pad includes: a first portion in contact with the upper surface of the second via; and a second portion other than the first portion; wherein the first portion of the lower surface of the third via pad has a concave curved surface corresponding to an upper surface of the second via; and wherein the second portion of the lower surface of the second circuit pattern has a flat surface.

In addition, an upper surface of the third via pad includes a portion vertically overlapping with the first portion of the lower surface of the third via pad and positioned higher than the upper surface of the second insulating layer.

In addition, an upper surface and a lower surface of the first via have a flat surface, and wherein the upper and lower surfaces of the second via have curved surfaces.

In addition, the first via has a shape in which the width decreases from an upper surface to a lower surface, and wherein the second via has a shape having the upper surface and the lower surface having the same width.

In addition, each of the second and third circuit patterns includes a trace, and wherein each of an upper surface and a lower surface of the trace has a flat surface.

In addition, the first via has a first height; and wherein the second via has a second height that is less than the first height.

On the other hand, the manufacturing method of the circuit board according to the embodiment includes forming a first circuit pattern including a first via pad on a first carrier board; forming a first insulating layer covering the first circuit pattern on the first carrier board; forming a first via connected to the first via pad in the first insulating layer; forming a second circuit pattern including a second via pad connected to the first via on an upper surface of the first insulating layer; manufacturing a first substrate including the first insulating layer, the first circuit pattern, the second circuit pattern, and the first via by removing the first carrier board; forming a third circuit pattern including a third via pad on a second carrier board; forming a bump corresponding to a second via on the third via pad; forming a second insulating layer having a lower surface positioned higher than a lower surface of the second via while covering the third circuit pattern on the second carrier board; manufacturing a second substrate including the second insulating layer, the third circuit pattern, and the second via by removing the second carrier board; and adhering the second substrate on the first substrate by performing a pressing process in a state where the lower surface of the second via is positioned on the second via pad of the first substrate; wherein a lower surface of the second via has a curved surface convex in a downward direction, wherein an upper surface of the second via pad has a curved surface concave in a downward direction to correspond to the lower surface of the second via; wherein an upper surface of the second via has a curved surface convex in an upward direction, and a lower surface of the third via pad has a curved surface concave in an upward direction to correspond to the upper surface of the second via.

In addition, the upper surface of the second via pad and the lower surface of the third via pad include a first portion contacting the lower surface or the upper surface of the second via, and a second portion other than the first portion, wherein the first portion has a concave curved surface corresponding to the second via, and the second portion has a flat surface.

In addition, an upper surface of the third via pad includes a portion that vertically overlaps with the first portion of the lower surface of the third via pad and is positioned higher than an upper surface of the second insulating layer.

In addition, upper and lower surfaces of the first via have flat surfaces, and upper and lower surfaces of the second via have curved surfaces.

In addition, the first via has a shape in which the width decreases from the upper surface to the lower surface, and the second via has a shape in which the widths of the upper and lower surfaces are the same.

In addition, each of the second and third circuit patterns includes a trace, and each of an upper surface and a lower surface of the trace have a flat surface.

In addition, the first via has a first height, and the second via has a second height that is smaller than the first height.

Advantageous Effects

The circuit board of the embodiment includes an outermost circuit pattern disposed on both sides of an insulating layer. In this case, the outermost circuit pattern may include a first outer layer circuit pattern disposed on a lowermost side of the at least one insulating layer and a second outer layer circuit pattern disposed on an uppermost side of the at least one insulating layer. In this case, both the first outer layer circuit pattern and the second outer layer circuit pattern in the embodiment may have a structure buried in the insulating layer. Accordingly, both the first outer layer circuit pattern and the second outer layer circuit pattern of the embodiment have a structure buried in the insulating layer, and accordingly, a thickness of the circuit board may be reduced by the thickness of the first outer layer circuit pattern and/or the second outer layer circuit pattern, and product slimming may be achieved.

In addition, when only one of the first and second outer circuit patterns is buried in the insulating layer, there is a problem in that warpage due to the asymmetric structure occurs during a manufacturing process of the circuit board. On the other hand, in the embodiment, since both the first and second outer layer circuit patterns are buried in the insulating layer, the occurrence of warpage of the circuit board may be minimized, and thus product reliability may be improved.

MODES OF THE INVENTION

Figure 1A:
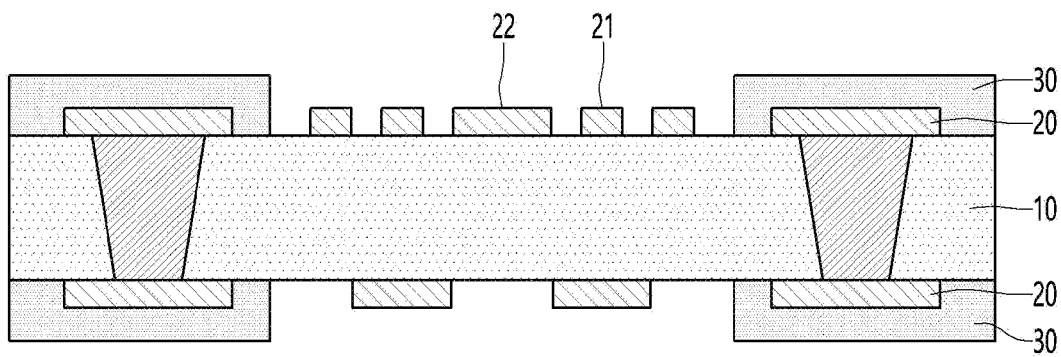
FIGS. 1a and 1b are a view showing a circuit board manufactured by an SAP method according to a comparative example.

Hereinafter, embodiments disclosed in the present specification will be described in detail with reference to the accompanying drawings, but identical or similar elements are denoted by the same reference numerals regardless of reference numerals, and redundant descriptions thereof will be omitted. The suffixes "module" and "portion" for the components used in the following description are given or used interchangeably in consideration of only the ease of writing the specification, and do not have meanings or roles that are distinguished from each other by themselves. In addition, in describing the embodiments disclosed in the present specification, if it is determined that a detailed description of related known technologies may obscure the subject matter of the embodiments disclosed in the present specification, the detailed description thereof will be omitted. In addition, the accompanying drawings are only for making it easier to understand the embodiments disclosed in the present specification, and the technical idea disclosed in the present specification is not limited by the accompanying drawings, and this should be understood to include all changes, equivalents, or substitutes included in the spirit and scope of the present invention.

Terms including ordinal numbers such as first and second may be used to describe various elements, but the elements are not limited by the terms. The above terms are used only for the purpose of distinguishing one component from another component.

When a component is referred to as being "contacted" or "connected" to another component, it may be directly connected or connected to the other component, but other components may exist in the middle. On the other hand, when a component is referred to as being "directly contacted" or "directly connected" to another component, it should be understood that there is no other component in the middle.

Singular expressions include plural expressions unless the context clearly indicates otherwise.

In the present application, terms such as "comprises" or "have" are intended to designate the presence of features, numbers, steps, actions, components, parts, or combinations thereof described in the specification, but one or more other features. It is to be understood that the presence or addition of elements or numbers, steps, actions, components, parts, or combinations thereof, does not preclude in advance the possibility of being excluded.

Hereinafter, exemplary embodiments of the present invention will be described in detail with reference to the accompanying drawings.

Before describing; a present embodiment, a comparative example compared with the present embodiment will be described.

Figure 1B:
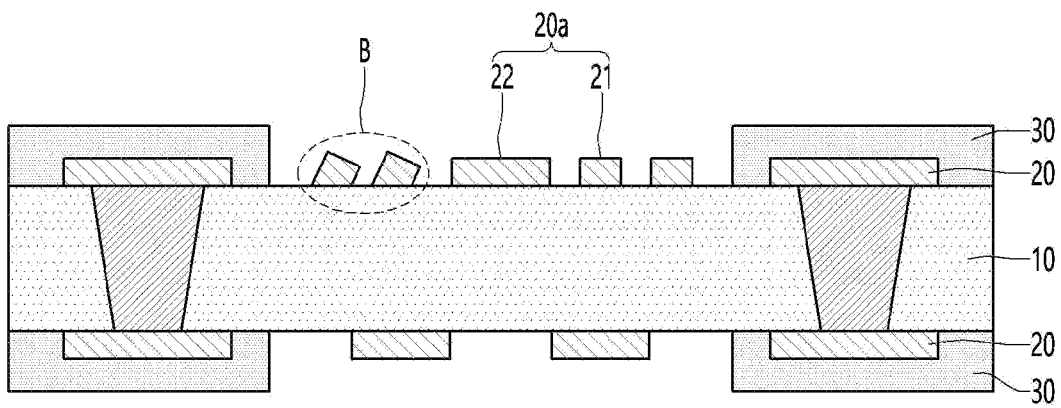

FIGS. 1a and 1b is a view showing a circuit board according to a comparative example.

Referring to FIG. 1a, a circuit board according to a comparative example includes a circuit pattern manufactured by a general SAP method.

Specifically, the circuit board includes an insulating layer 10, a circuit pattern 20, and a protective layer 30.

The circuit pattern 20 is disposed on upper and lower surfaces of the insulating layer 10, respectively.

In this case, at least one of the circuit patterns 20 disposed on the surface of the insulating layer 10 includes a fine circuit pattern.

Referring to FIG. 1a, the circuit pattern 20 disposed on the upper surface of the insulating layer 10 includes a fine circuit pattern. The fine circuit pattern includes a trace 21 which is a signal transmission wiring line, and a pad 22 for chip mounting and the like.

In addition, a protective layer 30 for protecting the circuit pattern 20 is disposed on the surface of the insulating layer 10.

In this case, an upper region of the insulating layer 10 includes a first region in which the protective layer 30 is disposed and a second region that is an open region in which the protective layer 30 is not disposed.

Accordingly, a part of the circuit pattern 20 disposed on the upper surface of the insulating layer 10 is covered by the protective layer 30, and the remaining part is exposed to an outside without being covered by the protective layer 30.

In this case, the trace 21 and the pad 22 corresponding to the fine circuit pattern as described above are disposed in the second region that is the open region of the protective layer 30.

For example, at least one of the trace 21 and the pad 22 has a width/interval of 15 μm/15 μm or less.

In this case, when the circuit pattern formed in the open region of the protective layer 30 is a pattern having a width exceeding 15 μm rather than a fine circuit pattern, it may be strong against external impact.

However, as shown in FIG. 1B, the width and interval of the trace 21 and the pad 22, which are the fine circuit patterns of an outermost layer, are getting smaller as the circuit pattern is gradually refined, the fine circuit pattern easily collapses due to an external impact when the fine circuit pattern protruding one the upper surface of the insulating layer 10 is disposed in the second region that is the open region of the protective layer.

That is, as in B of FIG. 1B, the trace 21 corresponding to the fine circuit pattern of the outermost layer has an extremely fine pattern shape, and thus it can easily collapse or be swept away by a small external impact.

On the other hand, recently, a fine circuit pattern disposed in an open region of the protective layer while having a structure buried in the insulating layer is formed using the ETS method.

Figure 2:
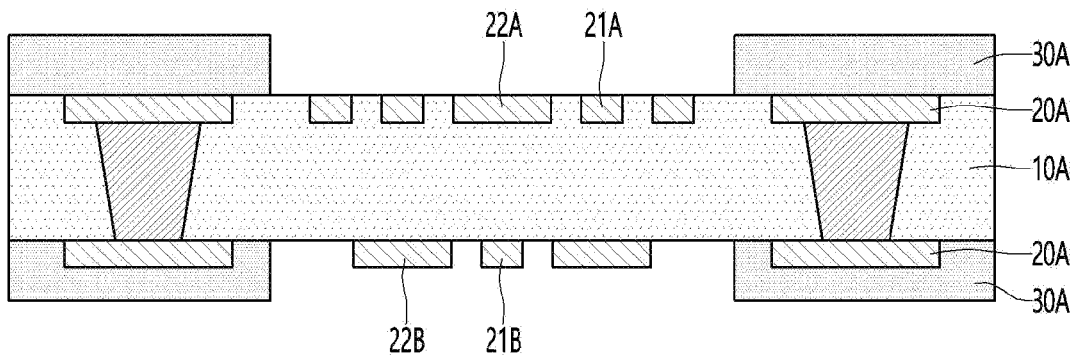
FIG. 2 is a view showing a circuit board manufactured by an ETS method according to a comparative example.

FIG. 2 is a view showing a circuit board manufactured by an ETS method in a comparative example.

Referring to FIG. 2, specifically, the circuit board includes an insulating layer 10A, a circuit pattern 20A, and a protective layer 30A.

The circuit pattern 20A is disposed on upper and lower surfaces of the insulating; layer 10A, respectively.

In this case, at least one of the circuit patterns 20A disposed on the surface of the insulating layer 10A includes a fine circuit pattern.

Here, when the circuit pattern is formed by the ETS method, the first circuit pattern formed has a structure buried in the insulating layer 10A. Accordingly, when an initially formed circuit pattern is formed as a fine circuit pattern, the fine circuit pattern may have a structure in which the fine circuit pattern is buried in the insulating layer 10A even in the comparative example.

That is, the circuit board manufactured by the ETS method includes a fine circuit pattern having a structure buried in the surface of the insulating layer 10A. That is, the fine circuit pattern includes a trace 21A, which is a signal transmission wiring line, and a pad 22A for mounting a chip or the like.

And, when the circuit board is manufactured by the ETS method as described above, the fine circuit pattern is protected from external impact, and because the fine circuit pattern has a structure buried in the insulating layer.

However, the circuit pattern formed last in the circuit board manufactured by the ETS method in the comparative example includes a problem in that it protrudes above the surface of the insulating layer 10A.

That is, the circuit board of the comparative example includes the trace 21A and the pad 22A having a structure buried in one side of the insulating layer 10A. In addition, the circuit board of the comparative example includes a trace 21B and a pad 22B having a structure protruding from the other side of the insulating layer 10A.

However, as described above, in the circuit board in the comparative example, the circuit pattern on one side has a structure buried in the insulating layer, but the circuit pattern disposed on the other side has a structure protruding above the surface of the insulating layer, and accordingly, there is a problem in that the degree of warpage due to the mutually asymmetric structure increases.

In addition, the circuit pattern disposed on the other side of the circuit board of the comparative example cannot be formed as a fine circuit pattern, and if the protruding circuit pattern is a fine pattern, there is a reliability problem as described in FIGS. 1a and 1b.

In addition, recently, interest in circuit boards that can reflect the development of 5G technology is increasing. At this time, in order to apply the 5G technology, the circuit board must have a high multi-layer structure, and accordingly the circuit pattern must be miniaturized. However, although it is possible to form a fine pattern in the comparative example, there is a problem that it cannot be reliably protected, and it includes various problems such as product warpage or thickness increase.

Accordingly, the embodiment provides a circuit board having a new structure capable of solving the reliability problem of an outermost fine pattern and a method for controlling the same.

Figure 3:
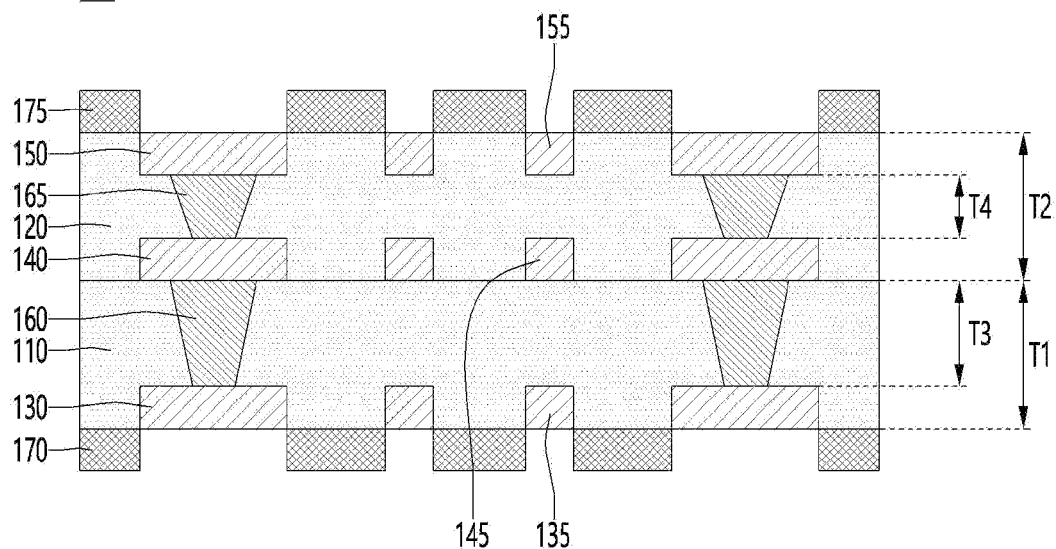
FIG. 3 is a view showing a circuit board according to a first embodiment.
Figure 4:
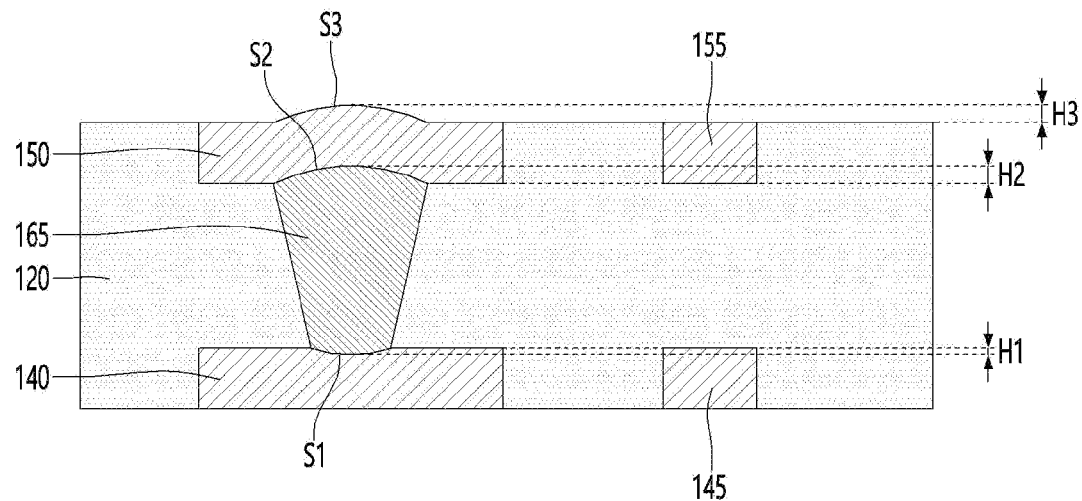
FIG. 4 is an enlarged view of region B of FIG. 3.
Figure 5:
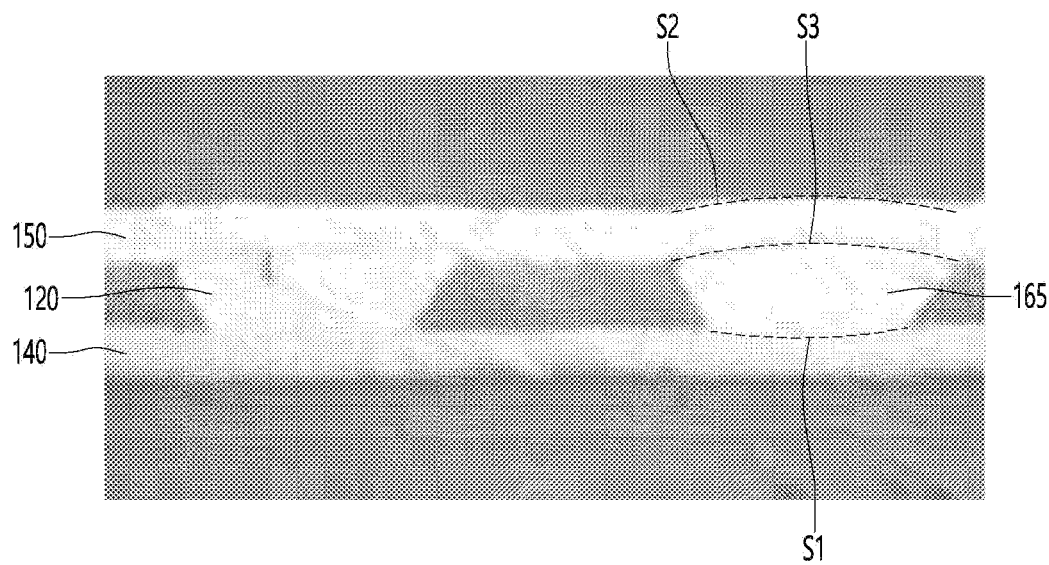
FIG. 5 is a view showing an example of the circuit board manufactured according to a first embodiment.

FIG. 3 is a view showing a circuit board according to a first embodiment, FIG. 4 is an enlarged view of region B of FIG. 3, and FIG. 5 is a view showing an example of the circuit board manufactured according to a first embodiment.

Hereinafter, the circuit board according to the first embodiment will be described with reference to FIGS. 3 to 5.

Before describing FIGS. 3 to 5, the circuit board according to the embodiment may have a multilayer structure. Preferably, the circuit board according to the embodiment may have a structure of 3 or more layers based on the number of layers of the circuit pattern. However, this is only an example, and is not limited thereto. That is, the circuit board according to the embodiment may have a number of layers smaller than 3 layers, or alternatively, may have a number of layers larger than 3 layers.

However, the circuit board in the embodiment is for solving the problem of the ETS method or the SAP of the comparative example. At this time, the ETS method in the comparative example has a structure in which only one circuit pattern among the circuit patterns of the outermost layer is buried in the insulating layer, and accordingly, in the embodiment, a three-layer circuit board having a buried structure on both sides will be described.

FIGS. 3 to 5, the circuit board 100 includes an insulating layer.

Preferably, the circuit board 100 may include first and second insulating layers 110 and 120 to implement a 3-layer circuit pattern structure. That is, the first insulating layer 110 of the embodiment may mean an insulating layer disposed on a lowermost side of the multi-layered insulating layer stacked structure. Also, the second insulating layer 120 may refer to an insulating layer disposed on an uppermost side of the multi-layered insulating layer stacked structure. In addition, as described above, in the circuit board according to the embodiment, at least one insulating layer may be additionally disposed between the first insulating layer 110 and the second insulating layer 120.

The first and second insulating layers 110 and 120 are a substrate on which an electric circuit capable of changing wiring is formed, and may include all of a printed circuit board and an insulating substrate made of an insulating material capable of forming circuit patterns on the surface thereof.

For example, at least of the first and second insulating layers 110 and 120 may be rigid or may be flexible. For example, at least of the first and second insulating layers 110 and 120 may include glass or plastic. In detail, at least of the first and second insulating layers 110 and 120 may include chemically strengthened/semi-tempered glass such as soda lime glass or aluminosilicate glass, or strengthened or flexible plastic such as polyimide (PI), polyethylene terephthalate (PET), propylene glycol (PPG) and polycarbonate (PC), or sapphire.

In addition, at least of the first and second insulating layers 110 and 120 may include an optical isotropic film. For example, at least one of the first and second insulating layers 110 and 120 may be includes COC (cyclic Olefin Copolymer), COP (Cyclic Olefin Polymer), photo isotropic polycarbonate (polycarbonate, PC), or photo isotropic polymethyl methacrylate (PMMA).

In addition, at least of the first and second insulating layers 110 and 120 may be bent while having a partially curved surface. That is, at least of the first and second insulating layers 110 and 120 may be bent while having a partially flat surface and a partially curved surface. In detail, at least of the first and second insulating layers 110 and 120 may have a curved end while having a curved surface, or may have a surface including a random curvature and may be bent or curved.

In addition, at least of the first and second insulating layers 110 and 120 may be a flexible substrate having a flexible characteristic. Also, at least of the first and second insulating layers 110 and 120 may be a curved or bent substrate. At this time, at least one of the first and second insulating layers 110 and 120 may represent an electrical wiring connecting circuit components based on a circuit design as a wiring diagram, and an electrical conductor may be reproduced on the insulating material. In addition, at least one of the first and second insulating layers 110 and 120 may form a wiring for mounting electrical components and circuitry connecting them, and may mechanically fix components other than the electrical connection function of the components.

A circuit pattern may be disposed on surfaces of the first and second insulating layers 110 and 120.

That is, a circuit pattern may be disposed on each surface of the first insulating layer 110 and the second insulating layer 120.

Here, the circuit pattern in the embodiment may include an inner layer circuit pattern and an outer layer circuit pattern. The inner layer circuit pattern may refer to a circuit pattern disposed between the first insulating layer 110 and the second insulating layer 120. In addition, the outer layer circuit pattern may refer to a circuit pattern disposed on the lower surface of the first insulating layer 110 of the lowermost side and a circuit pattern disposed on the upper surface of the second insulating layer 120 of the uppermost side.

Preferably, the circuit pattern may include a first circuit pattern disposed on a lower surface of the first insulating layer 110, a second circuit pattern disposed on an upper surface of the first insulating layer 110, and a third circuit pattern disposed on an upper surface of the second insulating layer 120. In this case, the first circuit pattern and the third circuit pattern may be an outer layer circuit pattern, and the second circuit pattern may be an inner layer circuit pattern.

Meanwhile, in the above description, although the outer layer circuit pattern is disposed on the lower surface of the first insulating layer 110 and the upper surface of the second insulating layer 120, respectively, but substantially, the outer circuit pattern may have a structure buried in a lower portion of the first insulating layer 110 and an upper portion of the second insulating layer 120, respectively.

The first circuit pattern may be disposed to be buried in the lower surface of the first insulating layer 110. For example, the upper surface of the first circuit pattern may be positioned higher than the lower surface of the first insulating layer 110. For example, the lower surface of the first circuit pattern may be positioned on the same plane as the lower surface of the first insulating layer 110. However, the embodiment is not limited thereto, and the lower surface of the first circuit pattern may be positioned higher than the lower surface of the first insulating layer 110 through processing (eg, chemical or physical polishing, etching, etc.) of the lower surface of the first circuit pattern.

The first circuit pattern may include a trace 135 and a pad 130. The pad 130 may include a via pad connected to a via, which will be described later.

The second circuit pattern may be disposed on the upper surface of the first insulating layer 110. For example, the upper surface of the second circuit pattern may be positioned higher than the upper surface of the first insulating layer 110. For example, the lower surface of the second circuit pattern may be disposed in direct contact with the upper surface of the first insulating layer 110. That is, the second circuit pattern may be disposed to have a structure protruding on the upper surface of the first insulating layer 110.

In addition, the second circuit pattern is an inner layer circuit pattern, and accordingly, although the second circuit pattern has a protruding structure on the first insulating layer 110, it may be covered by the second insulating layer 120.

The second circuit pattern may include a trace 145 and a pad 140.

The third circuit pattern may be disposed to be buried in the upper surface of the second insulating layer 120. For example, the lower surface of the third circuit pattern may be positioned lower than the upper surface of the second insulating layer 120. For example, an upper surface of the third circuit pattern may be positioned on the same plane as an upper surface of the second insulating layer 120. However, the embodiment is not limited thereto, the upper surface of the third circuit pattern may be positioned lower than the upper surface of the second insulating layer 120 through processing (eg, chemical or physical polishing, etching, etc.) of the upper surface of the third circuit pattern.

The third circuit pattern may include a trace 155 and a pad 150. The pad 150 may include a via pad connected to a via, which will be described later. In this case, the pad 150 and the trace 155 of the third circuit pattern may have different heights. Here, having different heights may mean that the upper surface of the pad 150 and the upper surface of the trace 155 of the third circuit pattern have different heights. For example, the upper surface of the pad 150 of the third circuit pattern may be positioned higher than the upper surface of the trace 155. For example, the upper surface of the pad 150 of the third circuit pattern may include a portion positioned higher than the upper surface of the trace 155.

The first to third circuit patterns may include fine circuit patterns. Preferably, the first to third circuit patterns may include a fine circuit pattern having a line width of 10 μm or less and an interval between the patterns of 10 μm or less. Accordingly, when the first circuit pattern and the third circuit pattern have a structure protruding under the lower surface of the first insulating layer 110 or on the upper surface of the second insulating layer 120, an impact may be applied to the microcircuit pattern from an external factor, and thus a reliability problem may occur. Accordingly, the first circuit pattern in the embodiment has a structure buried under the first insulating layer 110, and the third circuit pattern has a structure buried under the second insulating layer 120, and through this, the reliability of the outer layer circuit pattern is improved.

Meanwhile, the first to third circuit patterns are a wire that transmits an electrical signal, and may be formed of a metal material having high electrical conductivity. To this end, the first to third circuit patterns may be formed of at least one metal material selected from gold (Au), silver (Ag), platinum (Pt), titanium (Ti), tin (Sn), copper (Cu), and zinc (Zn). In addition, the first to third circuit patterns may be formed of a paste or solder paste including at least one metal material selected from gold (Au), silver (Ag), platinum (Pt), titanium (Ti), tin (Sn), copper (Cu), and zinc (Zn) having excellent bonding power. Preferably, the first to third circuit patterns may be formed of copper (Cu) having high electrical conductivity and a relatively inexpensive price.

At least one of the first to third circuit patterns may be formed by an additive process, a subtractive process, a modified semi additive process (MSAP), and a semi additive process (SAP) process, which are typical circuit board manufacturing processes, and a detailed description thereof will be omitted here.

Meanwhile, vias may be disposed in the first insulating layer 110 and the second insulating layer 120. The vias are disposed in each insulating layer, and accordingly, circuit patterns disposed in different layers may be electrically connected to each other.

A first via 160 may be disposed in the first insulating layer 110. The first via 160 may electrically connect a first circuit pattern buried under the first insulating layer 110 and a second circuit pattern protruding above the upper surface of the first insulating layer 110. For example, one end of the first via 160 may directly contact the upper surface of the first circuit pattern, and the other end of the first via 160 may directly contact the lower surface of the second circuit pattern.

A second via 165 may be disposed in the second insulating layer 120. The second via 165 may electrically connect a third circuit pattern buried in the upper portion of the second insulating layer 120 and a second circuit pattern protruding above the upper surface of the first insulating layer 110. For example, one end of the second via 160 may directly contact the upper surface of the first circuit pattern, and the other end of the first via 160 may directly contact the lower surface of the second circuit pattern.

The first via 160 may be formed by filling an inside of a via hole (not shown) formed in the first insulating layer 110 with a conductive material.

The via hole may be formed by any one of mechanical, laser, and chemical processing. When the through hole is formed by machining, methods such as milling, drilling, and routing may be used, and when formed by laser processing, a UV or CO2 laser method may be used. In addition, when formed by chemical processing, a chemical containing aminosilane, ketones, or the like may be used. Accordingly, the insulating layer 110 may be opened.

Meanwhile, the laser processing is a cutting method that concentrates optical energy on a surface to melt and evaporate a part of the material to take a desired shape, accordingly, complex formations by computer programs can be easily processed, and even composite materials that are difficult to cut by other methods can be processed.

In addition, the laser processing has a cutting diameter of at least 0.005 mm, and has a wide range of possible thicknesses.

As the laser processing drill, it is preferable to use a YAG (Yttrium Aluminum Garnet) laser, a CO2 laser, or an ultraviolet (UV) laser. YAG laser is a laser that can process both copper foil layers and insulating layers, and CO2 laser is a laser that can process only insulating layers.

When the via hole is formed, the first via 160 may be formed by filling the inside of the through hole with a conductive material. The metal material forming the first via 160 may be any one material selected from copper (Cu), silver (Ag), tin (Sn), gold (Au), nickel (Ni), and palladium (Pd). In addition, the conductive material filling may use any one or a combination of electroless plating, electrolytic plating, screen printing, sputtering, evaporation, inkjetting and dispensing.

Meanwhile, the second via 165 may be formed in a different method from that of the first via 160. That is, the first via 160 may be formed by filling the inside of the via hole formed in the first insulating layer 110 with a metal material. Alternatively, the second via 165 may be formed by forming bumps using a mask (not shown) and performing a pressing process while the formed vias are positioned on the second circuit pattern. The second insulating layer 120 may be attached to the first insulating layer 110 by manufacturing a bump substrate by forming a second insulating layer 120 surrounding the third circuit pattern and the bump after forming the third circuit pattern and bump on the carrier board, and performing a pressing process in a state in which the manufactured bump substrate is disposed on the first insulating layer 110.

Accordingly, the first via 160 and the second insulating layer 120 may have different shapes. For example, the first via 160 and the second via 165 may have the same basic shape. That is, the basic shape of the first via 160 and the second via 165 may have a trapezoidal shape in which the width decreases from one surface to the other surface. However, the shape of the surface of the first insulating layer 110 may be different from the shape of the surface of the second via 165. A surface of the first via 160 may be a flat surface. Alternatively, the surface of the second via 165 may be a curved surface. For example, the second via 165 may be a convex surface protruding in an upper direction or a lower direction.

This will be described in more detail below.

Meanwhile, a protective layer may be disposed on an outermost side of the circuit board 100. Preferably, the first protective layer 170 may be disposed on the lower surface of the first insulating layer 110. In addition, a second protective layer 175 may be disposed on the upper surface of the second insulating layer 120.

The first protective layer 170 and the second protective layer 175 may be formed of at least one layer using any one or more of Solder Resist (SR), oxide, and Au. Preferably, the first protective layer 170 and the second protective layer 175 may be solder resist.

The first protective layer 170 and the second protective layer 175 may function to protect the lower surface of the first insulating layer 110 and the upper surface of the second insulating layer 120, respectively. In addition, the first protective layer 170 and the second protective layer 175 may function to protect a lower surface of the first circuit pattern and an upper surface of the second circuit pattern.

The first protective layer 170 may partially overlap the first circuit pattern. In the drawings, the first protective layer 170 is illustrated as having no overlapping portion with the first circuit pattern, but the embodiment is not limited thereto, and substantially, the first protective layer 170 may be disposed to cover at least a portion of a lower surface of the first circuit pattern. Also, the second protective layer 175 may partially overlap the third circuit pattern. In the drawings, the second protective layer 175 is illustrated as having no overlapping portion with the third circuit pattern, but the embodiment is not limited thereto, and substantially, the second protective layer 180 may be disposed to cover at least a portion of a lower surface of the third circuit pattern An area of the first protective layer 170 may be smaller than an area of the first insulating layer 110. Also, an area of the second protective layer 175 may be smaller than an area of the second insulating layer 120. That is, the first protective layer 170 may include an open region exposing the lower surface of the first circuit pattern buried in a lower portion of the first insulating layer 110. Also, the second protective layer 175 may include an open region exposing the upper surface of the third circuit pattern buried in an upper portion of the second insulating layer 120.

Hereinafter, a circuit pattern and a shape of a via according to an embodiment will be described in more detail.

The first via 160 may have a shape in which upper and lower surfaces are flat by forming a via hole in the first insulating layer 110 and filling the inside of the formed via hole with a metal material, and the width decreases from one surface to the other.

Meanwhile, the second via 165 may have a shape different from that of the first via 160. The second via 165 may be formed by performing a pressing process in a state in which a separately formed bump is positioned on the second circuit pattern. Accordingly, the second via 165 in the embodiment may have a curved surface in which the upper surface and the lower surface are convex in a specific direction rather than a flat surface.

In other words, a height of the upper surface of the second via 165 may change from one end to the other end. For example, the height of the upper surface of the second via 165 may increase from an edge to a center. Accordingly, an upper surface of the second via 165 may have a curved surface convex in an upward direction.

Also, a height of the lower surface of the second via 165 may change from one end to the other end. For example, the height of the lower surface of the second via 165 may decrease from an edge to a center. Accordingly, the lower surface of the second via 165 may have a curved surface convex in an downward direction.

Referring to FIG. 4, the circuit board includes vias for interlayer conduction. In this case, the via is substantially disposed in the insulating layer. In addition, the via may include a pad (which may be clearly referred to as a via pad) that is a circuit pattern disposed on the surface of the insulating layer.

Accordingly, the via of the circuit board according to the embodiment may include the first via 160, the first via pad 130 connected to the lower surface of the first via 160, a second via pad 140 connected to the upper surface of the first via 160, a second via 165 connected to an upper surface of the second via pad 140, and a third via pad 150 connected to an upper surface of the second via 165.

At this time, in the embodiment, the second via 165 and the third via pad 150 are attached on the second via pad 140 by performing a pressing process in a state in which the second via 160 and the third via pad 150 are positioned on the second via pad 140. Accordingly, the lower surface of the second via 165, an upper surface of the second via pad 140 in contact with a lower surface of the second via 165, an upper surface of the second via 165, a lower surface of the third via pad 150 in contact with the upper surface of the second via 165, and an upper surface overlapping a lower surface of the third via pad 150 in a vertical direction may have a curved surface rather than a flat surface.

For example, the upper surface of the second via pad 140 may include a first portion in contact with the lower surface of the second via 165 and a second portion other than the first portion. The first portion of the upper surface of the second via pad 140 may have a concave shape in a downward direction. For example, the first portion of the upper surface of the second via pad 140 may be a curved surface. In addition, the second portion of the upper surface of the second via pad 140 may be a flat surface.

A lower surface of the second via 165 may have a shape corresponding to the first portion of the upper surface of the second via pad 140. For example, the lower surface of the second via 165 may have a convex shape in a downward direction to correspond to the first portion of the upper surface of the second via pad 140. For example, the lower surface of the second via 165 may have a curved surface. Accordingly, at least a portion of the lower surface of the second via 165 may be positioned lower than the second portion of the upper surface of the second via pad 140.

An upper surface of the second via 165 may have a convex shape in an upward direction. For example, the upper surface of the second via 165 may have a curved surface. Accordingly, at least a portion of the upper surface of the second via 165 may be positioned higher than at least a portion of the lower surface of the third via pad 150.

The lower surface of the third via pad 150 may include a first portion in contact with the upper surface of the second via 165 and a second portion other than the first portion. The first portion of the lower surface of the third via pad 150 may have a shape corresponding to the upper surface of the second via 165. For example, the first portion of the upper surface of the third via pad 150 may have a concave shape in an upward direction. For example, the first portion of the lower surface of the third via pad 150 may be a curved surface. In addition, the second portion of the upper surface of the second via pad 140 may be a flat surface.

The upper surface of the third via pad 150 may include a first portion vertically overlapping with the first portion of the lower surface of the third via pad 150 and a second portion other than the first portion. In addition, the first portion of the upper surface of the third via pad 150 may have a shape corresponding to the first portion of the lower surface of the third via pad 150. For example, the first portion of the upper surface of the third via pad 150 may have a convex shape in an upward direction. For example, the first portion of the upper surface of the third via pad 150 may have a curved surface.

In addition, the second portion of the upper surface of the third via pad 150 and the second portion of the lower surface of the third via pad 150 may be a flat surface, respectively.

This may be a structural feature appearing in the process of attaching the first insulating layer 110 and the second insulating layer 120 to each other.

That is, the second via 165 and the third via pad 150 are formed on the second insulating layer 120. In addition, the second insulating layer 120 may be attached on the first insulating layer 110 by performing a pressing process in a state where the second via 165 is positioned on the second via pad 140. In this case, in the pressing process, the lower surface of the second via 165 and the first portion of the upper surface of the second via pad 140 may be pressed while in contact with each other. Also, the first portion of the upper surface of the second via pad 140 may have a concave shape in a downward direction by the pressing. In addition, the lower surface of the second via 165 may have a convex shape filling the first portion of the upper surface of the second via pad 140. At this time, the deformation of the lower surface of the second via pad 140 may also occur due to the deformation of the upper surface of the second via pad 140. However, the first via 160 is disposed under the second via pad 140, the deformation of the lower surface of the second via pad 140 may not occur by the support of the first via 160, or even if it does occur, it may not be visually distinguishable.

Also, in the pressing process, the first portion of the upper surface of the second via 165 and the lower surface of the third via pad 150 may be pressed while in contact with each other. In addition, the first portion of the lower surface of the third via pad 150 may have a concave shape in the upward direction by the pressing. In addition, the upper surface of the second via 165 may have a convex shape filling the first portion of the lower surface of the third via pad 150. At this time, the deformation of the first portion of the lower surface of the third via pad 150 may also make the upper surface of the third via pad 150 vertically overlapping therewith deformed. That is, the first portion of the upper surface of the third via pad 150 may have a curved shape that is convex in an upward direction to correspond to the first portion of the lower surface of the third via pad 150.

That is, the embodiment includes the second via pad 140, the third via pad 150, and the second via 165 therebetween. In addition, a contact surface S1 between the upper surface of the second via pad 140 and the lower surface of the second via 165 may have a convex shape in a downward direction. That is, the lower surface of the second via 165 may be convex downward by the first height H1 from the upper surface of the second via pad 140.

Also, a contact surface S2 between the lower surface of the third via pad 150 and the upper surface of the second via 165 may have a convex shape in an upward direction. That is, the upper surface of the second via 165 may be convex upward by a second height H2 from the lower surface of the third via pad 150. In this case, the second height H2 may be greater than the first height H1.

In addition, a portion S3 of the upper surface of the third via pad 150 that vertically overlaps with the contact surface S2 may be convex upward by a third height H3 than other portions of the upper surface of the third via pad 150. In this case, the third height H3 may correspond to the second height H2.

In the embodiment, a circuit board is formed by performing a pressing process in a state in which the bump substrate including a second insulating layer 120, a third via pad 150, and a second via 165 is positioned on the first insulating layer 110 as described above.

Accordingly, the third via pad 150 in the embodiment may have a structure buried in the second insulating layer 120. In addition, the overall thickness of the circuit board in an embodiment may be reduced by the thickness of the third via pad 150.

In other words, the first insulating layer 110 in the embodiment may have a first thickness T1. The first thickness T1 may correspond to a distance from an uppermost surface to a lowermost surface of the first insulating layer 110. In addition, the second insulating layer 120 in the embodiment may have a second thickness T1. The second thickness T2 may correspond to a distance from the uppermost surface to the lowermost surface of the second insulating layer 120. In addition, the first thickness T1 may correspond to the second thickness T2. In this case, both the second via pad 140 and the third via pad 150 are disposed in the second insulating layer 120 in the embodiment. Accordingly, the first via 160 in the embodiment may have a third thickness T3. Also, in the embodiment, the second via 165 may have a fourth thickness T4 smaller than the third thickness T3. That is, in a general circuit board, the first via and the second via have the same thickness. Alternatively, in the embodiment, as the third via pad 150 is buried in the second insulating layer 120, the thickness of the circuit board may be reduced by the thickness of the third circuit pattern such as the third via pad 150. In addition, the thickness of the second via 165 may be reduced by the same thickness of the third circuit pattern as the third via pad 150.

Meanwhile, when the second insulating layer 120, the second via 165, and the third circuit pattern are pressed on the first insulating layer 110 and the second circuit pattern, the second via 165 as described above, the second via pad 140 and the third via pad 150 of the second circuit pattern are deformed as they are pressed while in contact with each other. Unlike this, the second circuit pattern excluding the second via pad 140 and the third circuit pattern excluding the third via pad 150 are not deformed.

That is, as described above, the second circuit pattern and the third circuit pattern may include traces and via pads according to their functions. In addition, the via pad is deformed by pressure in the pressing process. Unlike this, the trace is not deformed by the pressure as described above, and thus maintains a planar state in which the surface is initially formed.

That is, the second circuit pattern includes the via pad 140 and the trace 145. In addition, the upper surface of the via pad 140 may be deformed to be concave in a downward direction by pressing the second via 165. However, the traces 145 of the second circuit pattern are covered only by the second insulating layer 120 in the pressing process, and thus the surface is not deformed. For example, the upper surface of the trace 145 of the second circuit pattern is not deformed differently from the via pad 140, and thus maintains a flat surface corresponding to the initially formed state.

In addition, the third circuit pattern includes via pads 150 and traces 155. Also, the lower surface of the via pad 150 may be deformed to be concave in the upward direction by the pressure of the second via 165. Also, the upper surface of the via pad 150 may be deformed to be convex in the upward direction by the pressure of the second via 165. In addition, the traces 155 of the third circuit pattern remain buried in the second insulating layer 120 only during the pressing process, and thus the traces is not deformed. For example, the upper surface of the trace 155 of the third circuit pattern is not deformed differently from the via pad 150, and thus maintains a flat surface corresponding to the initially formed state.

The circuit board of the embodiment includes an outermost circuit pattern disposed on both sides of an insulating layer. In this case, the outermost circuit pattern may include a first outer layer circuit pattern disposed on a lowermost side of the at least one insulating layer and a second outer layer circuit pattern disposed on an uppermost side of the at least one insulating layer. In this case, both the first outer layer circuit pattern and the second outer layer circuit pattern in the embodiment may have a structure buried in the insulating layer. Accordingly, both the first outer layer circuit pattern and the second outer layer circuit pattern of the embodiment have a structure buried in the insulating layer, and accordingly, a thickness of the circuit board may be reduced by the thickness of the first outer layer circuit pattern and/or the second outer layer circuit pattern, and product slimming may be achieved.

In addition, when only one of the first and second outer circuit patterns is buried in the insulating layer, there is a problem in that warpage due to the asymmetric structure occurs during a manufacturing process of the circuit board. On the other hand, in the embodiment, since both the first and second outer layer circuit patterns are buried in the insulating layer, the occurrence of warpage of the circuit board may be minimized, and thus product reliability may be improved.

FIGS. 6 to 14 are views showing the manufacturing method of the circuit board shown in FIG. 2 in order of process.

The circuit board in the first embodiment may be manufactured by forming a first substrate and a second substrate, respectively, and attaching the second substrate to the first substrate by pressing through a pressing process.

The first substrate may include a first insulating layer 110, a first circuit pattern, a first via 160, and a second circuit pattern in the circuit board described with reference to FIGS. 2 to 5. Also, in the circuit board described with reference to FIGS. 2 to 5, the second substrate may include the second insulating layer 120, the third circuit pattern, and the second via 165.

Hereinafter, the manufacturing process of the circuit board will be described in detail based on this.

Figure 6:
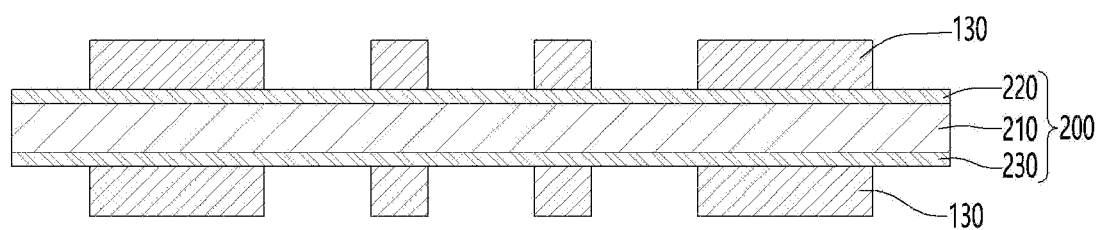
FIGS. 6 to 14 are views showing the manufacturing method of the circuit board shown in FIG. 2 in order of process.

Referring to FIG. 6, in the embodiment, a process of manufacturing the first substrate from both sides of the carrier board 200 may be performed by using the carrier board 200. In other words, a plurality of first substrates may be simultaneously manufactured around the carrier board 200.

The first substrate may be manufactured through an ETS method.

To this end, the carrier board 200 in the embodiment may be prepared.

The carrier board 200 may include a carrier film 210 and metal layers 220 and 230 respectively disposed on upper and lower surfaces of the carrier film 210.

The metal layers 220 and 230 may be used as a seed layer for forming a first circuit pattern of a first substrate.

That is, in the embodiment, when the carrier board 200 is prepared, a process of forming a first circuit pattern on the metal layers 220 and 230 may be performed using the metal layers 220 and 230 as a seed layer.

In this case, the first circuit pattern may be manufactured through the following process. In order to form the first circuit pattern of the embodiment, a mask (not shown) having an opening may be first formed on the metal layers 220 and 230. The opening of the mask may have an opening exposing a region in which the first circuit pattern is to be formed among surfaces of the metal layers 220 and 230. Next, when the mask is formed, plating may be performed in the opening of the mask using the metal layers 220 and 230 as a seed layer to form a first circuit pattern. In addition, the mask may be removed after the first circuit pattern is formed.

The first circuit pattern may include a via pad 130 connected to a first via 160 to be formed later, and a trace 135 serving as a signal line.

Figure 7:
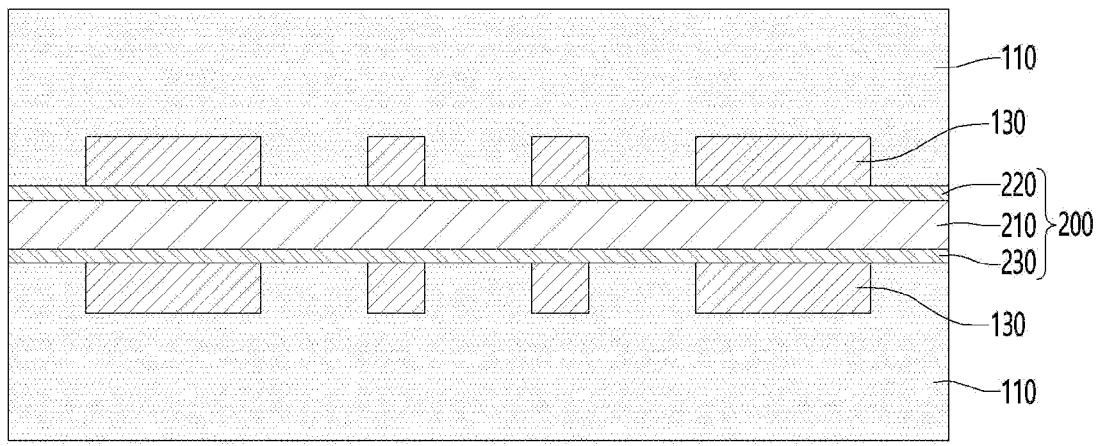

Next, referring to FIG. 7, a process of laminating the first insulating layer 110 on the metal layers 220 and 230 may be performed.

The first insulating layer 110 may be disposed on the metal layers 220 and 230 and may be formed to cover the first circuit pattern formed on the metal layers 220 and 230.

Figure 8:
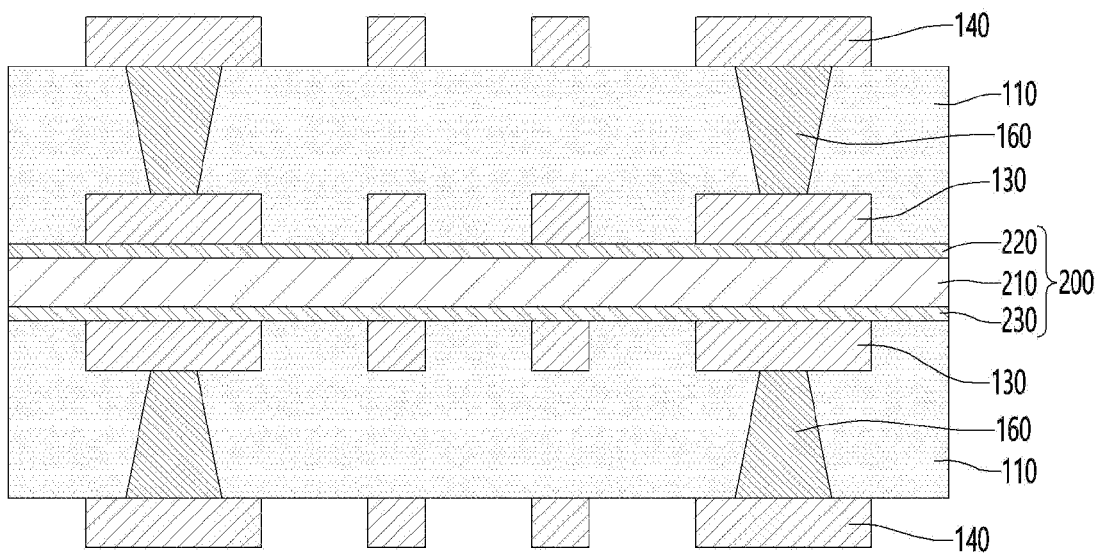

Next, referring to FIG. 8, a process of forming a second circuit pattern and a first via 160 on the first insulating layer 110 may be performed.

To this end, in the embodiment, a via hole (not shown) may be formed in the first insulating layer 110. The via hole may be formed to pass through the first insulating layer 110, and thus may be formed by exposing the upper surface of the via pad 130 among the first circuit patterns disposed on the metal layers 220 and 230.

When the via hole is formed, the first via 160 may be formed by filling the inside of the through hole with a conductive material. The metal material forming the first via 160 may be any one material selected from copper (Cu), silver (Ag), tin (Sze), gold (Au), nickel (Ni), and palladium (Pd). In addition, the conductive material filling may use any one or a combination of electroless plating, electrolytic plating, screen printing, sputtering, evaporation, inkjetting and dispensing.

Also, when the first via 160 is formed, a process of forming a second circuit pattern on the first insulating layer 110 may be performed. The second circuit pattern may include a via pad 140 connected to the first via 160 and a trace 145 corresponding to a signal line.

Figure 9:
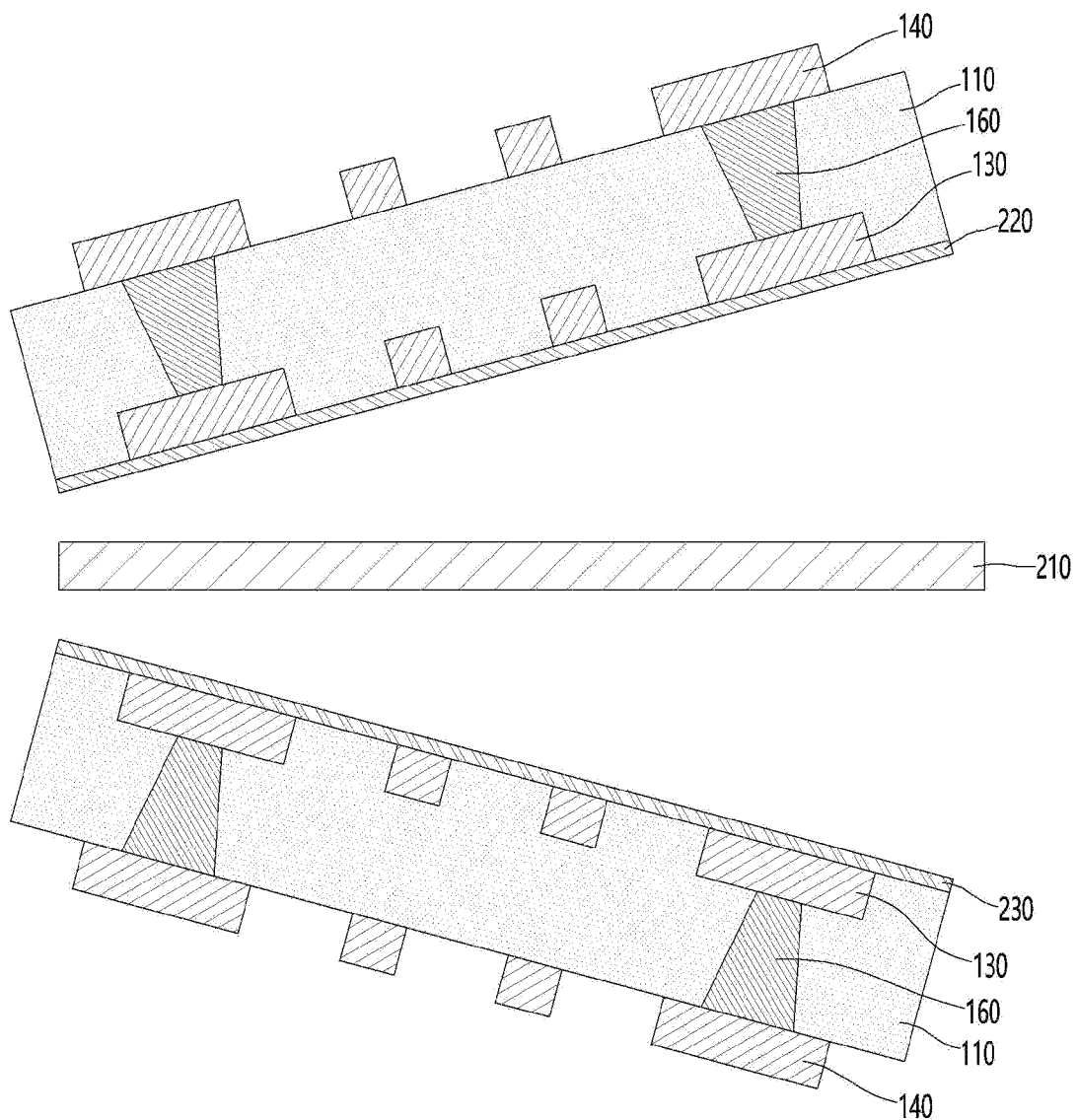

Next, referring to FIG. 9, a process of separating the first substrate manufactured through FIGS. 6 to 8 from the carrier board 200 may be performed.

Specifically, the first substrate may be manufactured on the upper side and the lower side of the carrier board 200, respectively. In addition, the first substrate including the metal layer 220 positioned on the upper side and the first substrate including the metal layer 230 positioned on the lower side can be separated from each other based on the carrier film 210 of the carrier board 200.

As described above, when the first substrate manufactured through the carrier board 200 is separated, a process of manufacturing the second substrate may be performed. The second substrate may be formed through a bump forming process. The bump may be used as a via.

Figure 10:
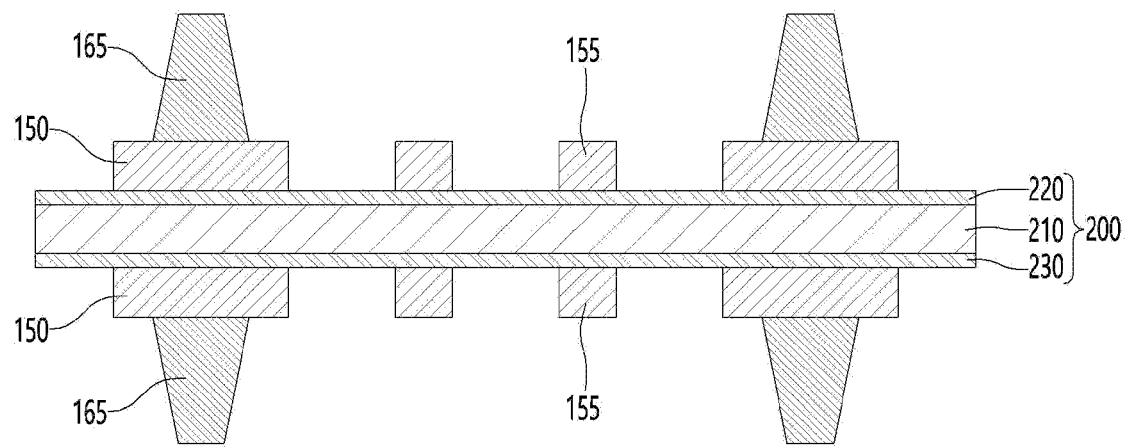

Specifically, referring to FIG. 10, the carrier board 200 in the embodiment may be additionally prepared to manufacture the second substrate. The carrier board 200 may include a carrier film 210 and metal layers 220 and 230 respectively disposed on the upper and lower surfaces of the carrier film 210 to correspond to the carrier board used in manufacturing the first substrate.

When the carrier board 200 is prepared, a process of forming a third circuit pattern and a second via 150 on the carrier board 200 may be performed.

Specifically, a process of forming a third circuit pattern on the metal layers 220 and 230 of the carrier board 200 may be performed. Since the process of forming the third circuit pattern is substantially the same as the process of forming the first circuit pattern, a detailed description thereof will be omitted.

The third circuit pattern may include via pads 150 and traces 155 as shown in the drawing.

Thereafter, when the third circuit pattern is formed, a process of forming the second via 160 on the via pad 150 of the third circuit pattern may be performed. Preferably, a general post-bump forming process in the embodiment may be performed to form a bump on the via pad 150 of the third circuit pattern. In this case, the bump may be used as the second via 165 in the circuit board.

Figure 11:
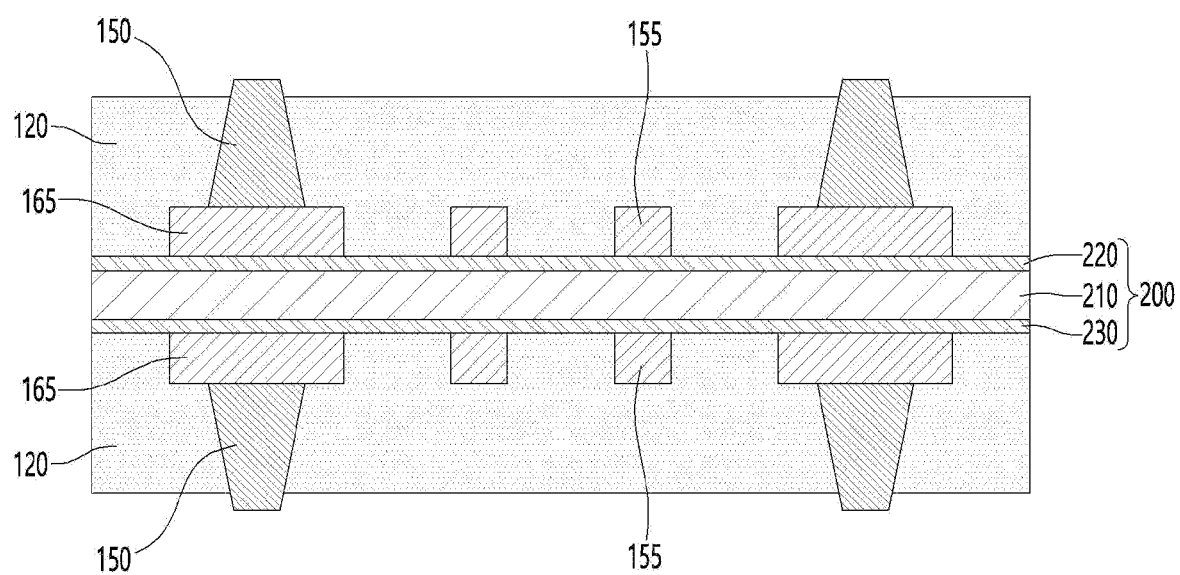

Next, referring to FIG. 11, when the third circuit pattern and the second via 165 are formed, a process of forming the second insulating layer 120 on the metal layers 220 and 230 may be performed.

In this case, the second insulating layer 120 may be formed while covering the third circuit pattern disposed on the metal layers 220 and 230 and exposing the surface of the second via 165. Preferably, the surface of the second insulating layer 120 may be positioned lower than the surface of the second via 165, and accordingly, the surface of the second via 165 and some side surfaces connected thereto may remain exposed even after the second insulating layer 120 is formed.

Figure 12:
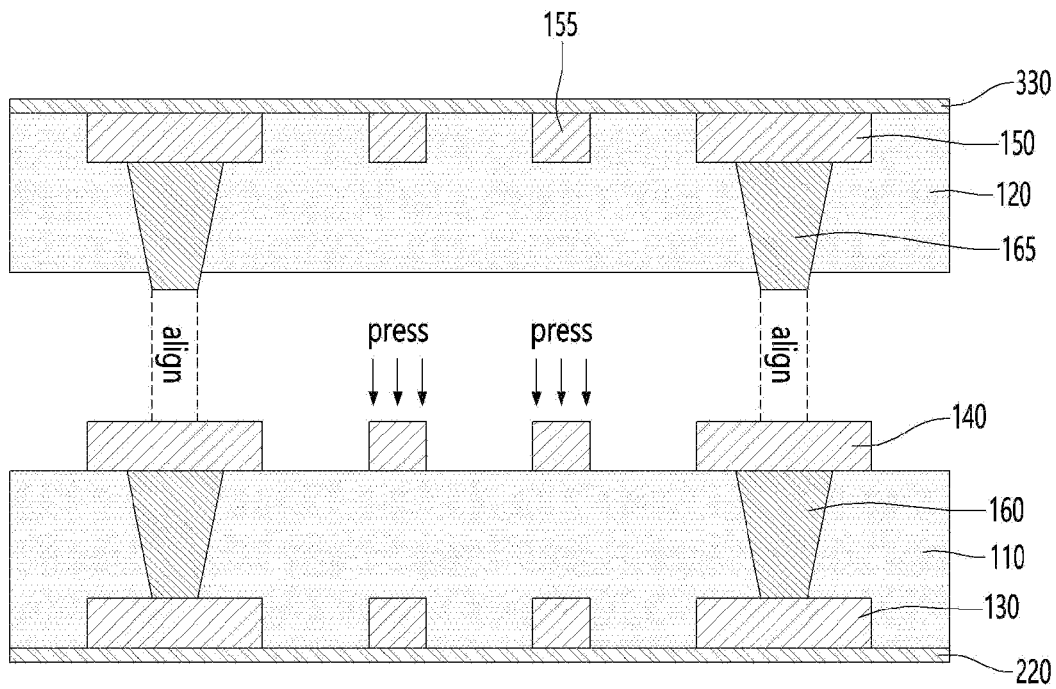

Next, referring to FIG. 12, a process of pressing and attaching the manufactured first and second substrates may be performed.

That is, the second circuit pattern of the manufactured first substrate is disposed in an upward direction, and the lower surface of the second via 165 of the second substrate is arranged in a downward direction. In addition, the pressing process may be performed while the lower surface of the second via 165 exposed through the second insulating layer 120 is aligned with the via pad 140 of the second circuit pattern of the first substrate.

In addition, when the pressing process is performed, the second substrate may be attached to the first substrate by the second insulating layer 120.

Figure 13:
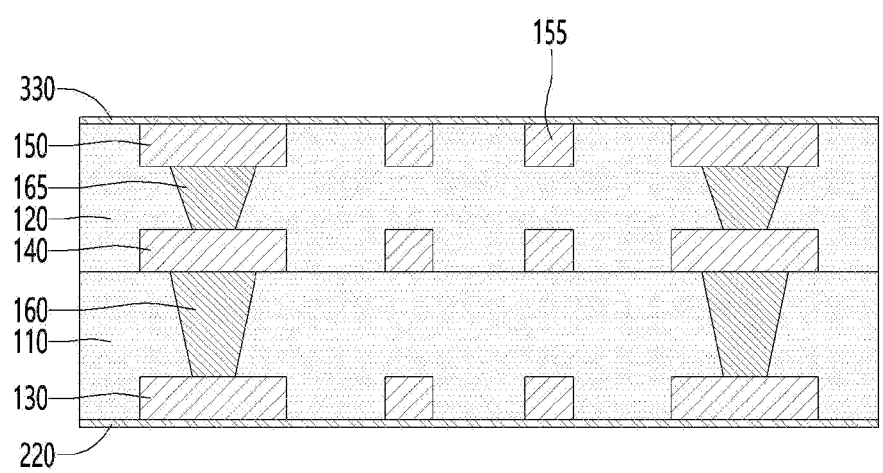
Figure 14:
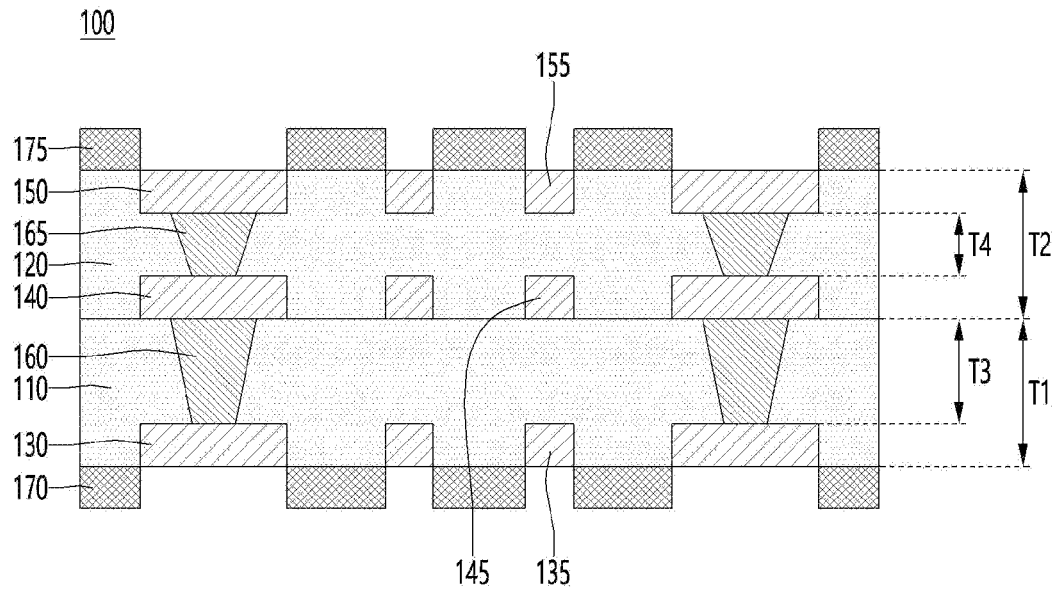

At this time, referring to FIG. 13, in the embodiment, the manufactured first and second, substrates are attached to each other through the pressing process as described above.

Accordingly, the first via 160 in the embodiment may have the same shape as the via in the comparative example. The upper and lower surfaces of first via 160 has a flat surface by forming a via hole in the first insulating layer 110 and filling the inside of the formed via hole with a metal material, and it may have a shape in which the width decreases from one surface to the other surface.

Meanwhile, the second via 165 may have a shape different from that of the first via 160. The second via 165 may be formed by performing a pressing process in a state in which a separately formed bump is positioned on the second circuit pattern. Accordingly, the second via 165 in the embodiment may have a curved surface in which the upper surface and the lower surface are convex in a specific direction rather than a flat surface.

That is, the second via 165 and the third via pad 150 in the embodiment are attached on the second via pad 140 by performing a pressing process in a state in which the second via 160 and the third via pad 150 are positioned on the second via pad 140. Accordingly, the lower surface of the second via 165, an upper surface of the second via pad 140 in contact with a lower surface of the second via 165, an upper surface of the second via 165, a lower surface of the third via pad 150 in contact with the upper surface of the second via 165, and an upper surface overlapping a lower surface of the third via pad 150 in a vertical direction may have a curved surface rather than a flat surface.

For example, the upper surface of the second via pad 140 may include a first portion in contact with the lower surface of the second via 165 and a second portion other than the first portion. The first portion of the upper surface of the second via pad 140 may have a concave shape in a downward direction. For example, the first portion of the upper surface of the second via pad 140 may be a curved surface.

In addition, the second portion of the upper surface of the second via pad 140 may be a flat surface.

A lower surface of the second via 165 may have a shape corresponding to the first portion of the upper surface of the second via pad 140. For example, the lower surface of the second via 165 may have a convex shape in a downward direction to correspond to the first portion of the upper surface of the second via pad 140. For example, the lower surface of the second via 165 may have a curved surface. Accordingly, at least a portion of the lower surface of the second via 165 may be positioned lower than the second portion of the upper surface of the second via pad 140.

An upper surface of the second via 165 may have a convex shape in an upward direction. For example, the upper surface of the second via 165 may have a curved surface. Accordingly, at least a portion of the upper surface of the second via 165 may be positioned higher than at least a portion of the lower surface of the third via pad 150.

The lower surface of the third via pad 150 may include a first portion in contact with the upper surface of the second via 165 and a second portion other than the first portion. The first portion of the lower surface of the third via pad 150 may have a shape corresponding to the upper surface of the second via 165. For example, the first portion of the upper surface of the third via pad 150 may have a concave shape in an upward direction. For example, the first portion of the lower surface of the third via pad 150 may be a curved surface. In addition, the second portion of the upper surface of the second via pad 140 may be a flat surface.

The upper surface of the third via pad 150 may include a first portion vertically overlapping with the first portion of the lower surface of the third via pad 150 and a second portion other than the first portion. In addition, the first portion of the upper surface of the third via pad 150 may have a shape corresponding to the first portion of the lower surface of the third via pad 150. For example, the first portion of the upper surface of the third via pad 150 may have a convex shape in an upward direction. For example, the first portion of the upper surface of the third via pad 150 may have a curved surface.

In addition, the second portion of the upper surface of the third via pad 150 and the second portion of the lower surface of the third via pad 150 may be a flat surface, respectively.

This may be a structural feature appearing in the process of attaching the first insulating layer 110 and the second insulating layer 120 to each other.

That is, the second via 165 and the third via pad 150 are formed on the second insulating layer 120. In addition, the second insulating layer 120 may be attached on the first insulating layer 110 by performing a pressing process in a state where the second via 165 is positioned on the second via pad 140. In this case, in the pressing process, the lower surface of the second via 165 and the first portion of the upper surface of the second via pad 140 may be pressed while in contact with each other. Also, the first portion of the upper surface of the second via pad 140 may have a concave shape in a downward direction by the pressing. In addition, the lower surface of the second via 165 may have a convex shape filling the first portion of the upper surface of the second via pad 140. At this time, the deformation of the lower surface of the second via pad 140 may also occur due to the deformation of the upper surface of the second via pad 140. However, the first via 160 is disposed under the second via pad 140, the deformation of the lower surface of the second via pad 140 may not occur by the support of the first via 160, or even if it does occur, it may not be visually distinguishable.

Also, in the pressing process, the first portion of the upper surface of the second via 165 and the lower surface of the third via pad 150 may be pressed while in contact with each other. In addition, the first portion of the lower surface of the third via pad 150 may have a concave shape in the upward direction by the pressing. In addition, the upper surface of the second via 165 may have a convex shape filling the first portion of the lower surface of the third via pad 150. At this time, the deformation of the first portion of the lower surface of the third via pad 150 may also make the upper surface of the third via pad 150 vertically overlapping therewith deformed. That is, the first portion of the upper surface of the third via pad 150 may have a curved shape that is convex in an upward direction to correspond to the first portion of the lower surface of the third via pad 150.

That is, the embodiment includes the second via pad 140, the third via pad 150, and the second via 165 therebetween. In addition, a contact surface S1 between the upper surface of the second via pad 140 and the lower surface of the second via 165 may have a convex shape in a downward direction. That is, the lower surface of the second via 165 may be convex downward by the first height H1 from the upper surface of the second via pad 140.

Also, a contact surface S2 between the lower surface of the third via pad 150 and the upper surface of the second via 165 may have a convex shape in an upward direction. That is, the upper surface of the second via 165 may be convex upward by a second height H2 from the lower surface of the third via pad 150. In this case, the second height H2 may be greater than the first height H1.

In addition, a portion S3 of the upper surface of the third via pad 150 that vertically overlaps with the contact surface S2 may be convex upward by a third height H3 than other portions of the upper surface of the third via pad 150. In this case, the third height H3 may correspond to the second height H2.

In the embodiment, a circuit board is formed by performing a pressing process in a state in which the bump substrate including a second insulating layer 120, a third via pad 150, and a second via 165 is positioned on the first insulating layer 110 as described above.

Accordingly, the third via pad 150 in the embodiment may have a structure buried in the second insulating layer 120. In addition, the overall thickness of the circuit board in an embodiment may be reduced by the thickness of the third via pad 150.

In other words, the first insulating layer 110 in the embodiment may have a first thickness T1. The first thickness T1 may correspond to a distance from an uppermost surface to a lowermost surface of the first insulating layer 110. In addition, the second insulating layer 120 in the embodiment may have a second thickness T1 The second thickness T2 may correspond to a distance from the uppermost surface to the lowermost surface of the second insulating layer 120. In addition, the first thickness T1 may correspond to the second thickness T2. In this case, both the second via pad 140 and the third via pad 150 are disposed in the second insulating layer 120 in the embodiment. Accordingly, the first via 160 in the embodiment may have a third thickness T3. Also, in the embodiment, the second via 165 may have a fourth thickness T4 smaller than the third thickness T3. That is, in a general circuit board, the first via and the second via have the same thickness. Alternatively, in the embodiment, as the third via pad 150 is buried in the second insulating layer 120, the thickness of the circuit board may be reduced by the thickness of the third circuit pattern such as the third via pad 150. In addition, the thickness of the second via 165 may be reduced by the same thickness of the third circuit pattern as the third via pad 150.

Meanwhile, when the second insulating layer 120, the second via 165, and the third circuit pattern are pressed on the first insulating layer 110 and the second circuit pattern, the second via 165 as described above, the second via pad 140 and the third via pad 150 of the second circuit pattern are deformed as they are pressed while in contact with each other. Unlike this, the second circuit pattern excluding the second via pad 140 and the third circuit pattern excluding the third via pad 150 are not deformed.

That is, as described above, the second circuit pattern and the third circuit pattern may include traces and via pads according to their functions. In addition, the via pad is deformed by pressure in the pressing process. Unlike this, the trace is not deformed by the pressure as described above, and thus maintains a planar state in which the surface is initially formed.

That is, the second circuit pattern includes the via pad 140 and the trace 145. In addition, the upper surface of the via pad 140 may be deformed to be concave in a downward direction by pressing the second via 165. However, the traces 145 of the second circuit pattern are covered only by the second insulating layer 120 in the pressing process, and thus the surface is not deformed. For example, the upper surface of the trace 145 of the second circuit pattern is not deformed differently from the via pad 140, and thus maintains a flat surface corresponding to the initially formed state.

In addition, the third circuit pattern includes via pads 150 and traces 155. Also, the lower surface of the via pad 150 may be deformed to be concave in the upward direction by the pressure of the second via 165. Also, the upper surface of the via pad 150 may be deformed to be convex in the upward direction by the pressure of the second via 165. In addition, the traces 155 of the third circuit pattern remain buried in the second insulating layer 120 only during the pressing process, and thus the traces is not deformed. For example, the upper surface of the trace 155 of the third circuit pattern is not deformed differently from the via pad 150, and thus maintains a flat surface corresponding to the initially formed state.

Next, in the embodiment, a process of removing the metal layer disposed on the lower surface of the first insulating layer 110 and the upper surface of the second insulating layer 120 may be performed.

Then, when the metal layer is removed, a process of forming protective layers 170 and 175 on the lower surface of the first insulating layer 110 and the upper surface of the second insulating layer 120 may be performed, respectively.

The circuit board of the embodiment includes an outermost circuit pattern disposed on both sides of an insulating layer. In this case, the outermost circuit pattern may include a first outer layer circuit pattern disposed on a lowermost side of the at least one insulating layer and a second outer layer circuit pattern disposed on an uppermost side of the at least one insulating layer. In this case, both the first outer layer circuit pattern and the second outer layer circuit pattern in the embodiment may have a structure buried in the insulating layer. Accordingly, both the first outer layer circuit pattern and the second outer layer circuit pattern of the embodiment have a structure buried in the insulating layer, and accordingly, a thickness of the circuit board may be reduced by the thickness of the first outer layer circuit pattern and/or the second outer layer circuit pattern, and product slimming may be achieved.

In addition, when only one of the first and second outer circuit patterns is buried in the insulating layer, there is a problem in that warpage due to the asymmetric structure occurs during a manufacturing process of the circuit board. On the other hand, in the embodiment, since both the first and second outer layer circuit patterns are buried in the insulating layer, the occurrence of warpage of the circuit board may be minimized, and thus product reliability may be improved.

Figure 15:
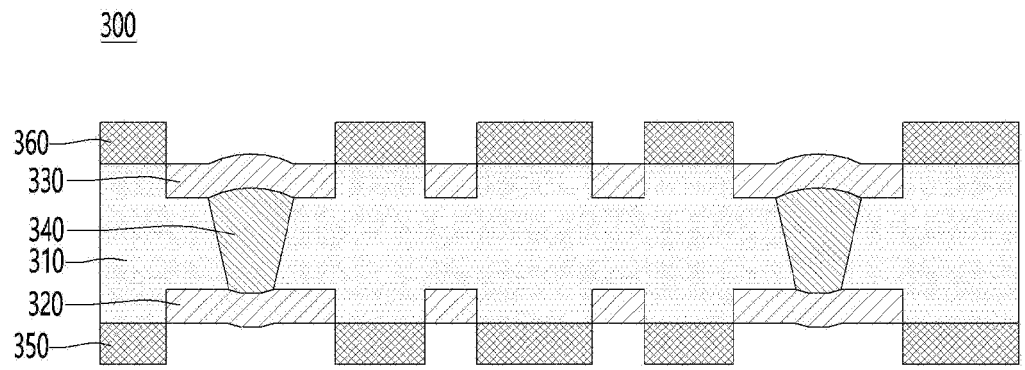
FIG. 15 is a view showing a circuit board according to a second embodiment.

FIG. 15 is a view showing a circuit board according to a second embodiment.

Referring to FIG. 15, the circuit board 300 according to the second embodiment has a difference in the number of insulating layers compared to the circuit board 100 according to the first embodiment.

That is, the circuit board 100 of the first embodiment includes two insulating layers, but differently, the circuit board 300 of the second embodiment may include one insulating layer.

That is, the circuit board 300 includes the insulating layer 310.

In addition, the circuit board 300 may include a first circuit pattern and a second circuit pattern that are respectively buried in the upper and lower portions of the insulating layer 310.

The first circuit pattern may be buried under the insulating layer 310 and may include a via pad 320.

In addition, the second circuit pattern may be buried on the insulating layer 310, and may include a via pad 330.

In addition, a via 340 electrically connecting the first circuit pattern and the second circuit pattern may be formed in the insulating layer 310.

In addition, protective layers 350 and 360 may be formed on the upper and lower surfaces of the insulating layer, respectively.

In this case, the first substrate in the second embodiment may include only the first circuit pattern. In addition, the second substrate may be the same as the second substrate of the first embodiment.

Accordingly, the via 340 in the second embodiment may have the same structure as the second via 165 in the first embodiment.

Also, the first circuit pattern in the second embodiment may have the same structure as the second circuit pattern in the first embodiment. However, in the first embodiment, since the first via is disposed under the second circuit pattern, the lower surface of the second circuit pattern is not deformed in the pressing process. In contrast, the first circuit pattern in the second embodiment may be deformed in the pressing process as no additional metal layer is disposed thereunder. For example, the lower surface of the first circuit pattern according to the second embodiment may include a convex portion in a downward direction in a region that vertically overlaps the lower surface of the via 340.

Also, the second circuit pattern in the second embodiment may have the same structure as the third circuit pattern in the first embodiment.

Figure 16:
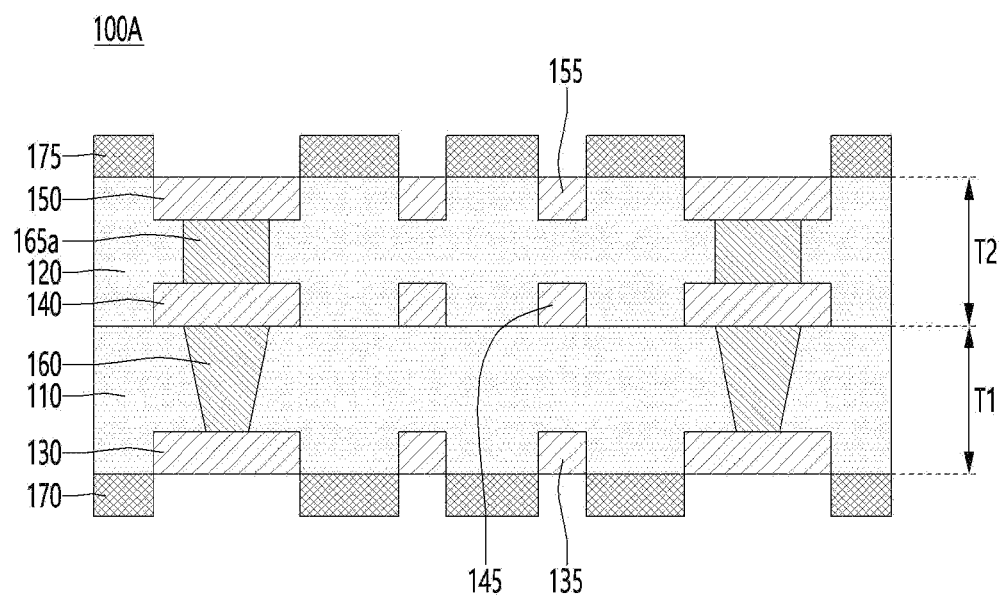
FIG. 16 is a view showing a circuit board according to a third embodiment.

FIG. 16 is a view showing a circuit board according to a third embodiment.

Referring to FIG. 16, the circuit board 100A may include a first insulating layer 110, a second insulating layer 120, a first circuit pattern, a second circuit pattern, a third circuit pattern, a first via 160, a second via 165a, a first protective layer 170, and a second protective layer 175.

At this time, the configuration of the circuit board 100A in the third embodiment may have a different shape of the second via compared to the configuration of the circuit board in the first embodiment.

That is, the second via 165 in the first embodiment has a trapezoidal shape in which the width gradually decreases from the upper side to the lower side. In the other hand, the upper and lower surfaces of the second via 165a according to the second embodiment may have the same width. For example, the second via 165 may be formed through a bump forming process, and thus may have a columnar shape having the same area as the upper surface and the lower surface.

And, a shape of the upper surface and the lower surface of the second via 165a, a shape of the upper surface of the second circuit pattern, and a shape of the upper and lower surfaces of the third circuit pattern in the third embodiment may correspond to the shape of upper and lower surfaces of the second via 165, the shape of the upper surface of the second circuit pattern, and the shape of the upper and lower surfaces of the third circuit pattern of the first embodiment.

Meanwhile, in the embodiment, a package substrate may be manufactured using the above-described circuit board.

For example, an adhesive portion (not shown) may be disposed on the pad 150 of the circuit board. In addition, a chip may be disposed on the adhesive part.

For example, a plurality of the pads 150 may be formed to be spaced apart in the width direction, and a plurality of the chips may be mounted on the plurality of pads.

For example, any one of a central processor (eg, CPU), a graphic processor (eg, GPU), a digital signal processor, an encryption processor, a microprocessor, and a microcontroller may be mounted on the pad 150.

For example, at least two different chips among a central processor (eg, CPU), a graphic processor (eg, GPU), a digital signal processor, an encryption processor, a microprocessor, and a microcontroller may be mounted on the pad.

The circuit board of the embodiment includes an outermost circuit pattern disposed on both sides of an insulating layer. In this case, the outermost circuit pattern may include a first outer layer circuit pattern disposed on a lowermost side of the at least one insulating layer and a second outer layer circuit pattern disposed on an uppermost side of the at least one insulating layer. In this case, both the first outer layer circuit pattern and the second outer layer circuit pattern in the embodiment may have a structure buried in the insulating layer. Accordingly, both the first outer layer circuit pattern and the second outer layer circuit pattern of the embodiment have a structure buried in the insulating layer, and accordingly, a thickness of the circuit board may be reduced by the thickness of the first outer layer circuit pattern and/or the second outer layer circuit pattern, and product slimming may be achieved.

In addition, when only one of the first and second outer circuit patterns is buried in the insulating layer, there is a problem in that warpage due to the asymmetric structure occurs during a manufacturing process of the circuit board. On the other hand, in the embodiment, since both the first and second outer layer circuit patterns are buried in the insulating layer, the occurrence of warpage of the circuit board may be minimized, and thus product reliability may be improved.

In addition, the circuit board of the embodiment can be applied to a 5G communication system, and thus, it is possible to further improve reliability by minimizing transmission loss at high frequencies. Specifically, the circuit board in the embodiment can be used at a high frequency and can reduce propagation loss.

The characteristics, structures and effects described in the embodiments above are included in at least one embodiment but are not limited to one embodiment. Furthermore, the characteristics, structures, effects, and the like illustrated in each of the embodiments may be combined or modified even with respect to other embodiments by those of ordinary skill in the art to which the embodiments pertain. Thus, it would be construed that contents related to such a combination and such a modification are included in the scope of the embodiments.

The above description has been focused on the embodiment, but it is merely illustrative and does not limit the embodiment. A person skilled in the art to which the embodiment pertains may appreciate that various modifications and applications not illustrated above are possible without departing from the essential features of the embodiment. For example, each component particularly represented in the embodiment may be modified and implemented. In addition, it should be construed that differences related to such changes and applications are included in the scope of the present invention defined in the appended claims.

The invention claimed is:

1. A circuit board comprising:
an insulating layer; and
an electrode layer passing through the insulating layer, wherein the electrode layer includes:
a first electrode;
a second electrode disposed on the first electrode; and
a third electrode disposed between the first electrode and the second electrode and connecting the first electrode and the second electrode in a vertical direction;
wherein a width in a horizontal direction of the third electrode decreases toward the first electrode,
wherein a lower surface of the third electrode includes a first convex portion convex toward the first electrode,
wherein an upper surface of the first electrode includes a first concave portion concave toward a lower surface of the first electrode, and
wherein a width of the first concave portion in the horizontal direction is less than or equal to a width of the first convex portion in the horizontal direction.

2. The circuit board of claim 1, wherein an upper surface of the second electrode includes a second convex portion convex in a direction away from the second electrode.

3. The circuit board of claim 2, wherein the second convex portion of the second electrode overlaps the first convex portion of the third electrode in the vertical direction.

4. The circuit board of claim 3, wherein an upper surface of the second electrode includes a first flat portion extending in the horizontal direction from the second convex portion, and
wherein the first flat portion is positioned lower than the second convex portion.

5. The circuit board of claim 4, wherein the first flat portion of the second electrode is in parallel to an upper surface of the insulating layer.

6. The circuit board of claim 3, wherein a lower surface of the second electrode includes a second concave portion concave toward the second convex portion of the second electrode, and a second flat portion extending in the horizontal direction from the second concave portion.

7. The circuit board of claim 6, wherein the second flat portion of the second electrode is positioned lower than the second concave portion of the second electrode and in parallel to an upper surface of the insulating layer.

8. The circuit board of claim 6, wherein an upper surface of the third electrode includes a third convex portion in contact with the second concave portion and convex toward the second convex portion of the second electrode.

9. The circuit board of claim 1, wherein a lower surface of the first electrode includes a fourth convex portion in a direction away from the third electrode, and
wherein the fourth convex portion of the first electrode overlaps the first convex portion of the third electrode in the vertical direction.

10. The circuit board of claim 9, wherein the lower surface of the first electrode includes a third flat portion extending in the horizontal direction from the fourth convex portion, and
wherein the third flat portion of the first electrode is positioned higher than the fourth convex portion of the first electrode.

11. The circuit board of claim 10, wherein the third flat portion of the first electrode is in parallel to a lower surface of the insulating layer.

12. The circuit board of claim 1, wherein the width of the first concave portion in the horizontal direction is equal to the width of the first convex portion in the horizontal direction.

13. The circuit board of claim 1, wherein the upper surface of the first electrode includes a fourth flat portion extending in the horizontal direction from the first concave portion, and
wherein the fourth flat portion is positioned higher than the first concave portion of the first electrode and in parallel to a lower surface of the insulating layer.

14. The circuit board of claim 10, wherein the first concave portion of the first electrode does not overlap a slope of a side surface of the third electrode in the vertical direction.

15. The circuit board of claim 4, wherein the electrode layer includes:
a trace disposed in the insulating layer to be spaced apart from the second electrode in the horizontal direction and overlapping the second electrode in the horizontal direction, and
wherein an upper surface of the trace is positioned lower than the second convex portion of the second electrode.

16. The circuit board of claim 15, wherein an upper surface of the insulating layer, the upper surface of the trace, and the first flat portion of the second electrode are positioned on a same plane.

17. The circuit board of claim 10, wherein the electrode layer includes:
a trace disposed in the insulating layer to be spaced apart from the first electrode in the horizontal direction and overlapping the first electrode in the horizontal direction, and
wherein a lower surface of the trace is positioned higher than the fourth convex portion of the first electrode.

18. The circuit board of claim 17, wherein a lower surface of the insulating layer, the lower surface of the trace, and the third flat portion of the first electrode are positioned on a same plane.

19. The circuit board of claim 2, wherein a width in the horizontal direction of the second convex portion of the second electrode is greater than a width in the horizontal direction of the fourth convex portion of the first electrode.

20. The circuit board of claim 2, comprising:
a protective layer disposed on the insulating layer and including an opening overlapping the second electrode along the vertical direction; and
a circuit portion embedded in the insulating layer and overlapping the second electrode along the horizontal direction and not in direct contact with the third electrode,
wherein the third electrode is a via electrode connecting the first electrode and the second electrode,
wherein the second electrode is a pad part in direct contact with the via electrode,
wherein the second convex portion is provided on an upper surface of the pad part, and
wherein a thickness in the vertical direction between uppermost and lowermost ends of the pad part is greater than a thickness in the vertical direction between uppermost and lowermost ends of the circuit portion.

* * * * *